DIFFERENTIAL AUTOMATIC GAIN CONTROL

Filed Aug. 12, 1955 2 Sheets-Sheet 1

INVENTORS
THOMAS O. STANLEY AND
LARRY A. FREEDMAN
BY
ATTORNEY

DIFFERENTIAL AUTOMATIC GAIN CONTROL

Filed Aug. 12, 1955 2 Sheets-Sheet 2

INVENTORS
THOMAS O. STANLEY AND
LARRY A. FREEDMAN
BY
ATTORNEY

United States Patent Office 2,831,968

Patented Apr. 22, 1958

2,831,968

DIFFERENTIAL AUTOMATIC GAIN CONTROL

Thomas O. Stanley, Princeton, and Larry A. Freedman, New Brunswick, N. J., assignors to Radio Corporation of America, a corporation of Delaware Application August 12, 1955, Serial No. 528,034

6 Claims. (Cl. 250—20)

The present invention relates generally to signal translating circuits to which are applied automatic gain control currents and/or voltages and particularly to such circuits connected in cascade and having a differential gain control action.

In signal receiving systems, it has been generally found desirable to provide automatic gain control means for controlling the system gain as an inverse function of the amplitude of the received carrier wave. The requirement of maintaining an optimum signal to noise ratio in the system dictates that for low amplitude received signals, the maximum signal gain of the system be utilized and for moderate amplitude received signals gain reduction should be accomplished in the high level succeeding stages of a cascade coupled system. However, the further requirement of the ability to process high amplitude signals without overload of the succeeding stages or intermodulation distortion in the preceding or first stage of the system dictates that at such signal levels the first stage of the system become essentially a passive linear network through automatic gain control action. One method of providing these characteristics is to establish different signal levels for the different controlled stages at which the automatic gain control action is effective and further to differentially bias the controlled stages through a mutually dependent action.

It is accordingly an object of the present invention to provide a cascade coupled signal translating system having a mutually dependent differential automatic gain control characteristic.

It is a further object of the present invention to provide, in a pair of cascade coupled transistor signal amplifier stages, an automatic gain control characteristic for establishing an optimum signal translating characteristic over a wide range of signal levels.

In accordance with the present invention, a control signal which is derived by conventional means from an automatic gain control detector, is applied to a controlling signal amplifier stage and to such other stages in the system as desired. One or more controlled stages, which are preferably preceding signal amplifier stages in the system, are connected in series relation for direct current with the controlling stage. Additional circuit means also provide direct current paths from the points of connection for the series connected stages to points of fixed reference potential or to points at which the potential is determined by the control signal. The distribution of current through the stages is adjusted as desired by selection of the resistance in each path. Since the bias voltage between the electrodes of the amplifying devices is small relative to the supply voltage, the potential of the points of connection between stages remains relatively fixed until cut-off of a stage is reached. Upon cut-off of a stage, the redistribution of current through the current paths is effected to bias the cut-off device well into the non-conducting region.

The novel features that are considered characteristic of this invention are set forth with particularlity in the appended claims. The invention itself, however, both as to its organization and method of operation, as well as additional objects and advantages thereof, will best be understood from the following description when read in connection with the accompanying drawings in which:

Figure 1:
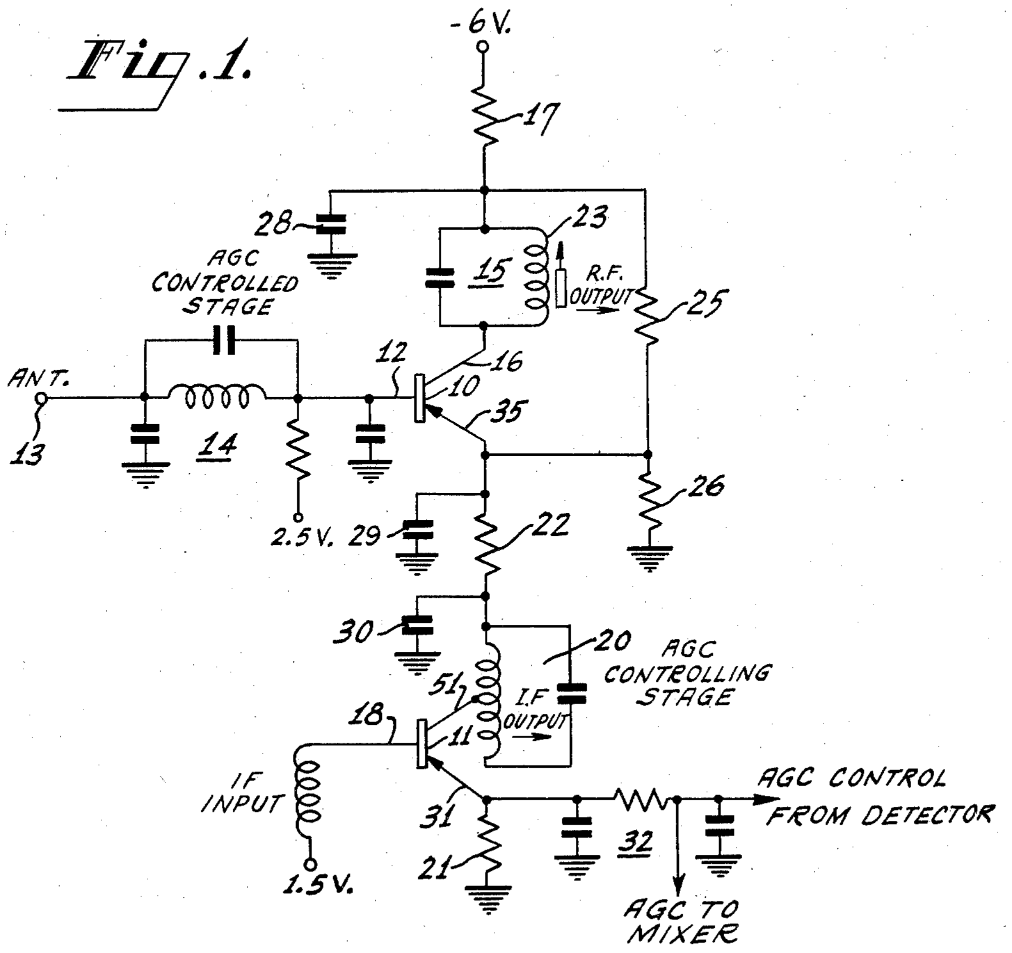
Figure 1 is a schematic circuit diagram of a pair of cascade coupled signal translating stages including a differential automatic gain control arrangement in accordance with the present invention.

Referring now to the drawings wherein like reference characters are used to designate like elements throughout the various figures, a pair of semiconductor devices, illustrated as transistors 10 and 11 of N conductivity type, are arranged as cascade coupled signal amplifiers. The schematic circuit diagram is arranged to most clearly show the direct current relationship and the automatic gain control action. It is to be understood, however, that there is signal coupling between the signal output circuit of the transistor 10 and the signal input circuit of the transistor 11. These two stages of signal amplification may, of course, represent any two succeeding stages in a receiving system, and other stages may also be included in the direct current series arrangement in accordance with the present invention.

For the purpose of illustrating one embodiment of the present invention, the transistor 10 is included in a radio-frequency signal amplifier stage which, with respect to the automatic gain control action, is the controlled stage. The transistor 11 is included in an intermediate-frequency signal amplifier stage which, with respect to the automatic gain control action, is the controlling stage.

Figure 3:
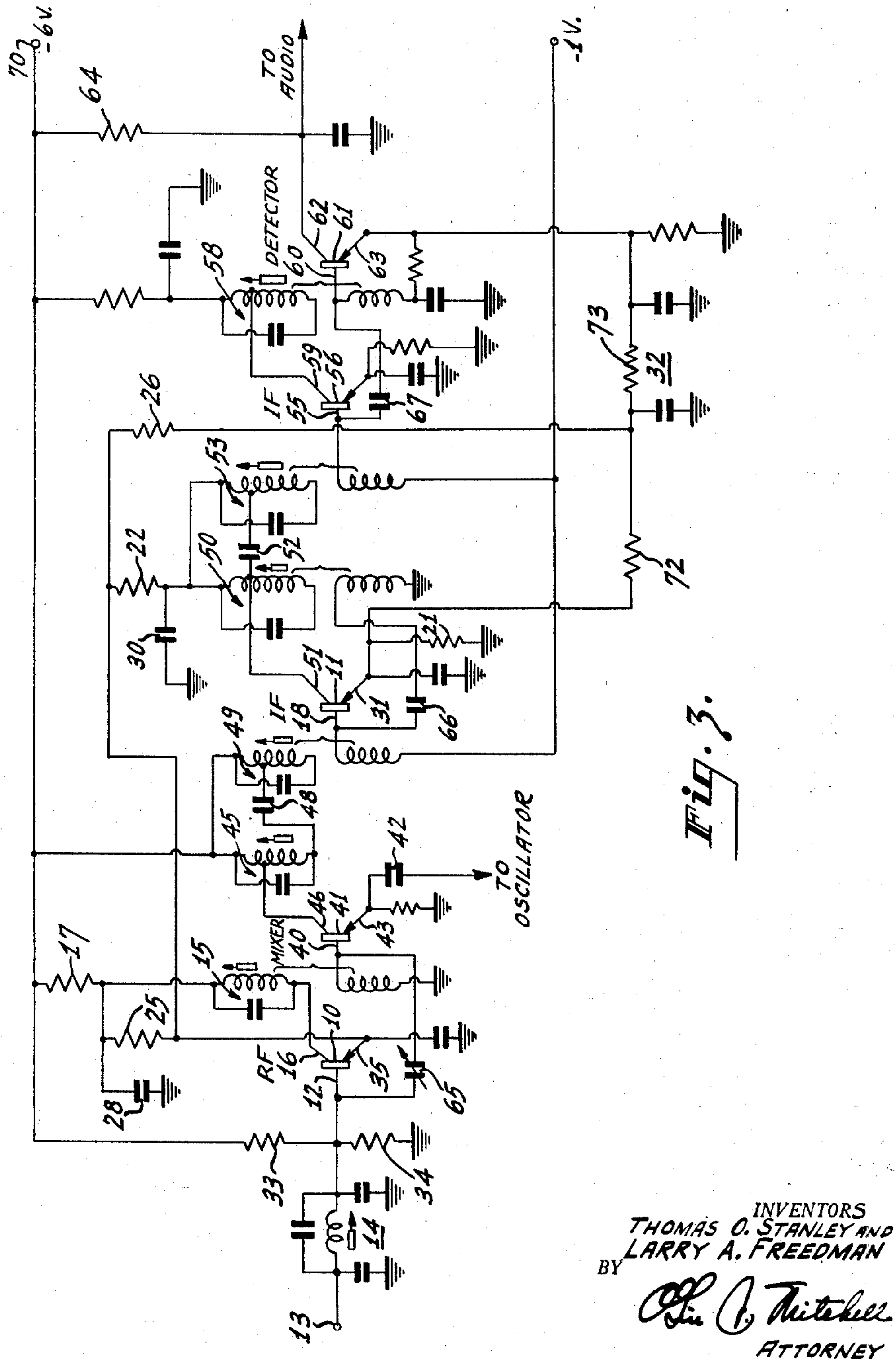
Figure 3 is a schematic circuit diagram of a portion of a broadcast signal receiver including a further embodiment of the differential automatic gain control arrangement in accordance with the present invention.

Radio frequency signals are applied to the base electrode 12 from an antenna terminal 13 through a coupling circuit 14. An amplified signal is derived from a parallel resonant collector load circuit 15 connected between the collector electrode 16 and a voltage divider resistor 17. These amplified signals are applied to the base electrode 18 of transistor 11 by a frequency conversion means such as a converter or mixer as shown in Figure 3. The amplified intermediate-frequency signal derived from the tuned circuit 20 may be applied to additional intermediate-frequency signal amplifier circuits or to the receiving system second detector, whichever is desired.

The direct current path for the two transistors is arranged in series relation. This path may be traced from ground through an emitter resistor 21, the emitter 31 and collector 51 electrodes of the transistor 11, a portion of the inductor of the tuned circuit 20, an isolating resistor 22, the emitter 35 and collector 16 electrodes of the transistor 10, the inductor 23 of parallel resonant circuit 15 and the voltage divider resistor 17. A parallel path for direct current is provided for the transistor 10 by a pair of resistors 25 and 26. Various points in the circuit are maintained at signal ground potential by means of the signal by-pass capacitors 28, 29 and 30.

An automatic gain control current is applied from an automatic gain control signal source to the emitter electrode 31 through a filter network 32. It is to be understood that the control signal may be applied to either the emitter electrode 31 or to the base electrode 18 by providing the proper polarity of control and the proper characteristic. Each of the base electrodes 12 and 18 is connected to a point of fixed bias potential of such a magnitude as to apply a forward bias to each device when the received signal wave has an amplitude such as to develop an automatic gain control current which is moderate or less.

Figure 2:
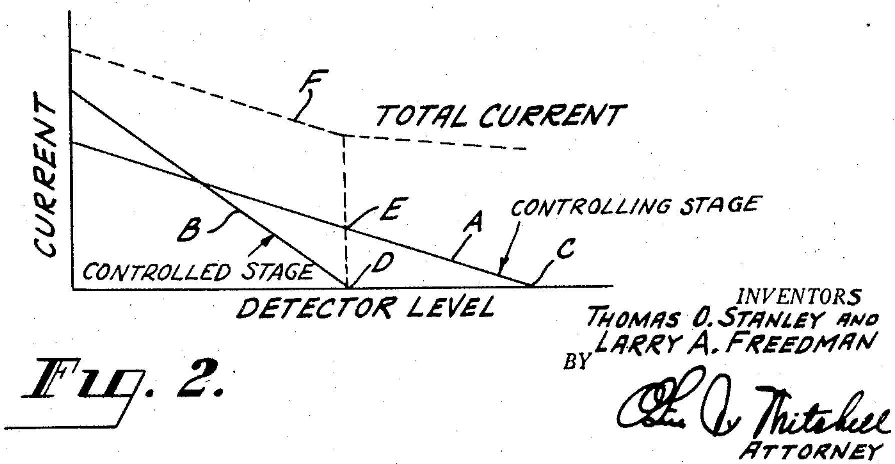
Figure 2 is a graph showing curves which illustrate the operation of the automatic gain control circuit of Figure 1.

As shown by the curves in the graph of Figure 2, the currents in the controlling stage, curve A, and controlled stage, curve B, are a function of the signal level at the second detector of the receiving system. Overload considerations dictate that the respective cut-off points C and D be well separated, and automatic gain control characteristic considerations dictate the current level, point E, in the intermediate-frequency amplifier stage or controlling stage at the point of cut-off for the radio frequency amplifier stage or controlled stage. However, the proper biasing of the transistor 10 requires current flow in the parallel path comprising the series connected resistors 25 and 26 in the same direction as in the transistor 10. The current through the common collector resistor 17, curve F, is then the sum of the current through the transistor 11 and the resistor 25.

Upon the application of an automatic gain control current to the emitter electrode 31, the current through the transistor 11 is reduced. The potential at the emitter electrode 35 of transistor 10 therefore tends to become more negative which tends to reduce the current through the transistor 10. This results in an increase in the current through the shunt resistor 25 and a decrease in the current through the common collector resistor 17 to provide the small negative voltage increment at the emitter electrode 35. The bias voltage existing between the base electrode 12 and the emitter electrode 35 is normally in the order of one-tenth of a volt and may be considered to vary only slightly as compared to the voltage variation appearing at the junction of the resistors 17 and 25. Since the current in the common collector resistor 17 is decreasing and the current in the shunt resistor 25 is increasing, there is a current change differential in the two stages. This, as may be seen from the curves A and B of Figure 2 provides a greater rate of change of current through the controlled transistor than that through the controlling transistor 11.

The increased rate of current change through the controlled transistor continues until the cut-off point (point D), shown as the intersection of the curve B with the ordinate, is reached. Moreover, beyond cut-off of the transistor 10, a large reverse bias is developed due to the fact that the excess current through the controlling transistor 11 further diminishes, providing a diminished current through the resistors 25 and 17. This results in the controlled transistor 10 becoming a linear passive network providing signal translation without intermodulation distortion.

If it is recognized that the signal gain of the transistors 10 and 11 is directly related to the currents illustrated by the curves A and B, it is seen that the stage gain at different levels of received signals and the rate of change of gain with varying signal levels in the two stages is such as to provide maximum signal-to-noise ratio at low received signal levels, which prevents overload of the stages at high received signal levels and avoids intermodulation distortion at high received signal levels.

The schematic circuit diagram shown in Figure 3 illustrates those portions of a signal receiving system which are necessary to process a received radio frequency signal, provide intermediate frequency signal amplification and provide detection. Accordingly, a received signal may be applied to the antenna terminal 13 and, through coupling network 14, to the base electrode 12 to be amplified as a radio-frequency signal and applied by inductive coupling to the base electrode 40 of a transistor 41 utilized as a mixer.

Signals from a local oscillator which, for the sake of simplicity is not shown, may be applied through a coupling capacitor 42 to the emitter electrode 43 wherein these signals are mixed with the received radio-frequency signal and due to the non-linear action of the device, the difference frequency or intermediate-frequency signal may be derived from the parallel resonant circuit 45 connected to the collector electrode 46. This intermediate-frequency signal is applied by means of capacitive coupling through the capacitor 48 to a second parallel resonant tuned circuit 49 which is inductively coupled to the base electrode 18 of the transistor 11 utilized as a first intermediate-frequency signal amplifier.

The amplified intermediate-frequency signal is derived from the parallel resonant tuned circuit 50 which is connected to the collector electrode 51 and which is capacitively coupled by means of a coupling capacitor 52 to a second parallel-resonant tuned circuit 53. This signal energy is transferred by means of inductive coupling to the base electrode 55 of a transistor 56 which is utilized as a second intermediate-frequency signal amplifier. The further amplified intermediate-frequency signal is derived from a parallel resonant tuned circuit 58 which is connected with the collector electrode 59 and which is inductively coupled to the base electrode 60 of a transistor 61 which is utilized as the second detector in the receiving system.

The transistor 61 may be provided with a suitable load impedance 64 so that the demodulated audio frequency signals may be derived from the collector electrode 62 and applied to any suitable utilization circuit such as an audio-frequency signal amplifier stage. Automatic gain control signals are derived from the emitter electrode 63 and applied through the filter network 32 to the emitter electrode 31 of the transistor 11. The automatic gain control action which is thus obtained is substantially identical to that described in connection with Figure 1 except that the resistor 26 is returned to a point in the filter network 32 instead of signal ground so that the potential of the low voltage terminal of the resistor 26 is controlled by the automatic gain control signal.

Each of the transistors 10, 11 and 56 is neutralized by means of the neutralizing capacitors 65, 66 and 67 which are connected between the base electrode of the neutralized transistor and the base electrode of the immediately succeeding transistor or to a separate winding on the output transformer of that particular stage so as to feedback the requisite amount of energy in proper phase as to provide neutralization.

An energizing bias for each of the transistors is provided from a terminal 70 to which may be connected the negative terminal of a source of energizing potential such as the negative terminal of a 6 volt supply. A fixed bias is applied from the negative terminal of a second source of direct current bias to the base electrode of the intermediate frequency stage transistor. The magnitude of the fixed bias is smaller than that applied to the terminal 70 and may be in the order of 1 volt as illustrated and may be derived from a suitable voltage divider arrangement associated with the supply utilized to provide the energizing bias at the terminal 70.

An inspection of Figure 3 of the drawing will indicate that the radio frequency signal amplifier stage and the first intermediate frequency amplifier stage are connected in series arrangement for direct current in the same manner as illustrated in Figure 1. That is the direct current path for the transistors 10 and 11 may be traced from the emitter electrode 31 through the transistor 11, a portion of the parallel resonant tuned circuit 50, the isolating resistor 22, the emitter electrode 35, the transistor 10, the parallel resonant tuned circuit 15 and the common collector load resistor 17 to the terminal 70. The shunt resistor 25 which is connected between the low voltage terminal of the common collector load resistor 17 and the emitter electrode 35 provides the shunt direct current path for the transistor 10. Until cutoff of the transistor 10, a substantially constant voltage is maintained at the emitter electrode 35 by virtue of the constant voltage provided at the base electrode 12 through the voltage divider comprising resistors 33 and 34 and the parallel path provided by the resistor 26 and the first intermediate frequency stage. Upon cut-off of the transistor 10, the redistribution of current through the resistors is such as to provide a large reverse bias between the emitter electrode 35 and the base electrode 12.

The effect of returning the resistor 26 to a point having a potential which is controlled by the automatic gain control signal is that of reducing the total current through the common collector load resistor 17 at a greater rate than illustrated in Figure 2. Accordingly, upon cut-off of the transistor 10, the reverse bias applied between the base electrode 12 and the emitter electrode 35 of transistor 10 is greater than it is if the resistor 26 is returned directly to a point of fixed reference potential such as signal ground. The rate of change of current and gain for each of the two transistors is not altered by this arrangement as the circuit components may be selected to provide the desired relation between them. The following list is a table of values for the various resistors which have been used in connection with the present invention.

| Resistors: | Ohms |
|---|---|
| **22** | 220 |
| **21** | 1800 |
| **26** | 2000 |
| **17** | 2200 |
| **25** | 2700 |

The automatic gain control system provided in accordance with the present invention permits the mutual gain control of succeeding stages in a signal translating system by means of a differential action so that maximum signal-to-noise-ratio, and a minimum of intermodulation distortion is provided over a wide range of received signal level while avoiding the possibility of overload in any of the stages.

Having thus described the present invention, what is claimed is:

1. In a signal receiving system the combination comprising, a common impedance element, a gain controlled signal translating stage and a gain controlling signal translating stage coupled in cascade signal processing relation and connected in direct current series relation in the order named with said common impedance element, a direct current conductive impedance element connected in shunt with said controlled stage, means for applying a variable gain control signal to said controlling stage for reducing the current therethrough and the gain thereof in accordance with the amplitude of said control signal, and means for maintaining the junction of said stages at a relatively fixed potential during a predetermined range of amplitude of said control signal to increase current flow through said direct current conductive impedance element and to reduce the gain of said controlled stage at a greater rate than that of the controlling stage, the potential of said junction being appreciably altered by decreased current flow through said direct current conductive impedance element during the period when said control signal amplitude is beyond said predetermined range.

2. In a signal receiving system including a first signal translating stage, a second signal translating stage and a source of automatic gain control signal having a magnitude proportional to the amplitude of a received carrier wave, an automatic gain control system comprising, means for applying said automatic gain control signal to said second stage to control the gain thereof and the current therethrough as an inverse function of the amplitude of said received carrier wave, said first and second stages being arranged in series relation for direct current, means for maintaining the junction of said stages at a substantially fixed potential during periods when the amplitude of said received signal is within a predetermined range and for appreciably varying the potential at said junction during periods when the amplitude of said received signal is beyond said predetermined range, and means providing a direct current path in shunt with said first stage to affect a change of current in said first stage in response to the change in current in said second stage, the rate of change of current in said first stage being greater than that of said second stage.

3. In a signal receiving system including a source of automatic gain control signal having a magnitude proportional to the amplitude of a received carrier wave, a first signal translating stage and a second signal translating stage each including a transistor having a plurality of electrodes, an automatic gain control system comprising, means for applying said automatic gain control signal to an electrode of the transistor of said second stage to control the gain thereof as an inverse function of the amplitude of said received carrier wave, the transistors of said first and second stages being arranged in series relation for direct current, and direct current conductive means connected in shunt with the transistor in said first stage to affect a change of current in said first stage by the change in current of said second stage, the rate of change of current in said first stage being greater than that of said second stage.

4. In a signal receiving system, including a first source of automatic gain control signal having a magnitude proportional to the amplitude of a received carrier wave, a first and second semiconductor device connected in cascade signal processing relation and including base, emitter and collector electrodes, an automatic gain control system comprising, means for applying said automatic gain control signal to one of the base and emitter electrodes of said second transistor to control the current in the emitter-collector current path thereof as an inverse function of the amplitude of said received carrier wave, the emitter-collector current paths of said transistors being connected in series relation for direct current, means for maintaining the junction of said transistors at a substantially fixed potential during periods when the amplitude of said control signal is within a predetermined range, and means providing a direct current path in shunt with said emitter-collector current path of said first transistor to affect changes in the current in said first transistor by the change in current through said second transistor, the rate of change of current in said first transistor being greater than that of said second transistor.

5. In a signal receiver, an automatic gain control system comprising in combination, a first resistor, a first and a second signal translating stage each including a junction transistor having base, emitter and collector electrodes, circuit means for connecting the emitter-collector current paths of said first and second transistors in series relation with said first resistor in the order named between a pair of terminals adapted to receive an energizing potential, a second resistor connected between the collector and emitter electrodes of said first transistor, means for providing a substantially fixed bias for the base electrode of each of said transistors, a third resistor connected between the junction of said transistors and one of said terminals, means including said means for providing a substantially fixed bias for maintaining the emitter electrode of said first transistor at a relatively fixed potential when said first transistor is in a conductive condition, and means for applying a gain control current to the emitter electrode of said second transistor, whereby the signal gain of said stages is altered at a different rate.

6. In a signal receiving system, the combination comprising, a controlling signal amplifier stage and a controlled signal amplifier stage, direct current conductive means connected in shunt with said controlled stage, said controlled and controlling stages being connected in direct current conductive series relation whereby the sole path for the direct current in said controlling stage is through said controlled stage and said means, direct current conductive means connected in shunt with said controlling stage, means for applying a substantially constant control bias to each of said stages, gain control means for applying a variable amplitude gain control current signal to said controlling stage, whereby the gain of said stages are mutually effected and the rate of change of gain of said controlled stage is greater than that of said controlling stage.

References Cited in the file of this patent

UNITED STATES PATENTS

| | | |
|---|---|---|
| 2,673,254 | Eland | Mar. 23, 1954 |
| 2,692,919 | Cohen | Oct. 26, 1954 |

FOREIGN PATENTS

| | | |
|---|---|---|
| 156,590 | Australia | May 19, 1954 |

OTHER REFERENCES

Principles of Transistor Circuits (Book) by Shea, 1953, Wiley, New York, pp. 120–122 cited.

U. S. DEPARTMENT OF COMMERCE

PATENT OFFICE

CERTIFICATE OF CORRECTION

Patent No. 2,831,968 Thomas O. Stanley et al. April 22, 1958

It is hereby certified that error appears in the printed specification of the above numbered patent requiring correction and that the said Letters Patent should read as corrected below.

Column 7, line 7, for "control current signal" read -- control signal --.

Signed and sealed this 24th day of June 1958.

(SEAL)

Attest:

KARL H. AXLINE

Attesting Officer

ROBERT C. WATSON

Commissioner of Patents